United States Patent
Poo et al.

(10) Patent No.: US 7,226,809 B2
(45) Date of Patent: Jun. 5, 2007

(54) SEMICONDUCTOR DEVICES AND SEMICONDUCTOR DEVICE COMPONENTS WITH PERIPHERALLY LOCATED, CASTELLATED CONTACTS, ASSEMBLIES AND PACKAGES INCLUDING SUCH SEMICONDUCTOR DEVICES OR PACKAGES AND ASSOCIATED METHODS

(75) Inventors: Chia Yong Poo, Singapore (SG); Boon Suan Jeung, Singapore (SG); Chua Swee Kwang, Singapore (SG); Low Siu Waf, Singapore (SG); Chan Min Yu, Singapore (SG); Neo Yong Loo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/440,590

(22) Filed: May 19, 2003

(65) Prior Publication Data

US 2003/0232462 A1    Dec. 18, 2003

Related U.S. Application Data

(62) Division of application No. 10/197,986, filed on Jul. 17, 2002, now Pat. No. 6,818,977.

(30) Foreign Application Priority Data

Jun. 18, 2002   (SG)   ............................. 200203684-6

(51) Int. Cl.
*H01L 21/44*   (2006.01)

(52) U.S. Cl. ...................... 438/109; 257/698

(58) Field of Classification Search ........ 438/107–111, 438/614, 666; 257/685–686, 690, 693, 698, 257/734, 777, E33.056, E23.001, E21.499
See application file for complete search history.

(56) References Cited

U.S. PATENT DOCUMENTS 4,956,694 A * 9/1990 Eide ........................... 257/686

(Continued)

FOREIGN PATENT DOCUMENTS

JP           59-27549          2/1984

(Continued)

OTHER PUBLICATIONS

NN81055595: Edge Mounted MLC Packaging Scheme. May 1981; IBM Technical Disclosure Bulletin, May 1981 US: vol. 23, Issue #12, pp. #5595-5598; Publication Date: May 1, 1981.

(Continued)

*Primary Examiner*—David Vu
(74) *Attorney, Agent, or Firm*—TraskBritt, PC

(57) ABSTRACT

A multichip assembly includes semiconductor devices or semiconductor device components with outer connectors on peripheral edges thereof. The outer connectors are formed by creating via holes along boundary lines between adjacent, unsevered semiconductor devices, or semiconductor device components, then plating or filling the holes with conductive material. When adjacent semiconductor devices or semiconductor device components are severed from one another, the conductive material in each via between the semiconductor devices is bisected. The semiconductor devices and components of the multichip assembly may have different sizes, as well as arrays of outer connectors with differing diameters and pitches. Either or both ends of each outer connector may be electrically connected to another aligned outer connector or contact area of another semiconductor device or component. Assembly in this manner provides a low-profile stacked assembly.

48 Claims, 8 Drawing Sheets

U.S. PATENT DOCUMENTS

| | | | |
|---|---|---|---|
| 5,111,278 A * | 5/1992 | Eichelberger | 257/698 |
| 5,138,115 A | 8/1992 | Lam | |
| 5,266,833 A * | 11/1993 | Capps | 257/690 |
| 5,313,098 A | 5/1994 | Eide | |
| 5,356,838 A | 10/1994 | Kim | |
| 5,434,745 A | 7/1995 | Shokrgozar et al. | |
| 5,440,452 A | 8/1995 | Kitahara | |
| 5,502,667 A * | 3/1996 | Bertin et al. | 365/51 |
| 5,541,450 A | 7/1996 | Jones et al. | |
| 5,639,695 A | 6/1997 | Jones et al. | |
| 5,723,901 A | 3/1998 | Katsumata | |
| 5,752,182 A | 5/1998 | Nakatsuka et al. | |
| 5,834,162 A | 11/1998 | Malba | |
| 5,925,924 A | 7/1999 | Cronin et al. | |
| 5,950,070 A | 9/1999 | Razon et al. | |
| 5,986,209 A | 11/1999 | Tandy | |
| 6,004,867 A | 12/1999 | Kim et al. | |
| 6,034,438 A * | 3/2000 | Petersen | 257/786 |
| 6,072,236 A | 6/2000 | Akram et al. | |
| 6,177,296 B1 | 1/2001 | Vindasius et al. | |
| 6,228,684 B1 | 5/2001 | Maruyama | |
| 6,252,300 B1 | 6/2001 | Hsuan et al. | |
| 6,306,680 B1 | 10/2001 | Fillion et al. | |
| 6,316,287 B1 | 11/2001 | Zandman et al. | |
| 6,323,546 B2 | 11/2001 | Hsuan et al. | |
| 6,326,689 B1 | 12/2001 | Thomas | |
| 6,335,225 B1 | 1/2002 | Doan | |
| 6,344,401 B1 | 2/2002 | Lam | |
| 6,352,923 B1 | 3/2002 | Hsuan et al. | |
| 6,358,833 B1 | 3/2002 | Akram et al. | |
| 6,376,769 B1 | 4/2002 | Chung | |
| 6,379,982 B1 | 4/2002 | Ahn et al. | |
| 6,379,999 B1 | 4/2002 | Tanabe | |
| 6,391,685 B1 | 5/2002 | Hikita et al. | |
| 6,461,956 B1 | 10/2002 | Hsuan et al. | |
| 6,504,244 B2 | 1/2003 | Ichinose et al. | |
| 6,521,485 B2 | 2/2003 | Su et al. | |
| 6,521,995 B1 | 2/2003 | Akram et al. | |
| 6,528,870 B2 | 3/2003 | Fukatsu et al. | |
| 6,534,386 B2 | 3/2003 | Irie | |
| 6,552,426 B2 | 4/2003 | Ishio et al. | |
| 6,562,647 B2 | 5/2003 | Zandman et al. | |
| 6,576,992 B1 | 6/2003 | Cady et al. | |
| 6,582,992 B2 | 6/2003 | Poo et al. | |
| 6,590,257 B2 | 7/2003 | Ohuchi | |
| 6,603,191 B2 | 8/2003 | Wakabayashi et al. | |
| 6,607,941 B2 | 8/2003 | Prabhu et al. | |
| 6,611,052 B2 | 8/2003 | Poo et al. | |
| 6,624,505 B2 | 9/2003 | Badehi | |
| 6,656,827 B1 | 12/2003 | Tsao et al. | |
| 6,693,358 B2 | 2/2004 | Yamada et al. | |
| 6,710,454 B1 | 3/2004 | Boon | |
| 6,727,116 B2 | 4/2004 | Poo et al. | |
| 6,781,244 B2 | 8/2004 | Prabhu | |
| 6,787,892 B2 | 9/2004 | Furuya et al. | |
| 6,797,544 B2 | 9/2004 | Sakai et al. | |
| 6,841,418 B2 | 1/2005 | Jeung et al. | |
| 6,849,802 B2 | 2/2005 | Song et al. | |
| 6,855,572 B2 | 2/2005 | Jeung et al. | |
| 6,856,023 B2 | 2/2005 | Muta et al. | |
| 6,876,061 B2 | 4/2005 | Zandman et al. | |
| 6,891,273 B2 | 5/2005 | Pu et al. | |
| 6,972,480 B2 | 12/2005 | Zilber et al. | |
| 7,000,312 B2 | 2/2006 | Fukunabe et al. | |
| 7,074,696 B1 | 7/2006 | Frankowsky et al. | |
| 2001/0009300 A1 | 7/2001 | Sugimura | |
| 2001/0042901 A1 | 11/2001 | Maruyarna | |
| 2002/0017398 A1 | 2/2002 | Hacke et al. | |
| 2002/0079567 A1 | 6/2002 | Lo et al. | |
| 2002/0096760 A1 | 7/2002 | Simelgor et al. | |
| 2003/0102160 A1 | 6/2003 | Gaudiello et al. | |
| 2003/0162326 A1 | 8/2003 | Tsubosaki et al. | |
| 2004/0156177 A1 | 8/2004 | Higashitani | |

FOREIGN PATENT DOCUMENTS

| | | |
|---|---|---|
| JP | 59-43558 | 3/1984 |
| JP | 63-232342 | 9/1988 |
| JP | 5-75014 | 3/1993 |
| JP | 6-97225 | 4/1994 |
| JP | 2001-44361 | 2/2001 |
| JP | 2001-210521 | 8/2001 |
| JP | 2003-8066 | 1/2003 |

OTHER PUBLICATIONS

Australian Search Report, Apr. 15, 2005, 5 pages.
U.S. Appl. No. 10/717,421, filed Nov. 19, 2003, entitled "Castellated Chip-Scale Packages and Methods for Fabricating the Same."
Australian Patent Office Written Opinion dated May 12, 2006.

* cited by examiner

SEMICONDUCTOR DEVICES AND SEMICONDUCTOR DEVICE COMPONENTS WITH PERIPHERALLY LOCATED, CASTELLATED CONTACTS, ASSEMBLIES AND PACKAGES INCLUDING SUCH SEMICONDUCTOR DEVICES OR PACKAGES AND ASSOCIATED METHODS

CROSS-REFERENCE TO RELATED APPLICATION

This application is a divisional of application Ser. No. 10/197,986, filed Jul. 17, 2002, now U.S. Pat. No. 6,818,977, issued Nov. 16, 2004.

BACKGROUND OF THE INVENTION

The present invention relates generally to semiconductor devices and semiconductor device components that are useful in low-profile packages, as well as to such packages. More specifically, the invention pertains to semiconductor device packages having true chip-carrier profiles, as well as to semiconductor packages with footprints that are substantially the same as or only slightly larger than the footprint of the chips thereof.

The dimensions of many different types of state of the art electronic devices are ever decreasing. To reduce the dimensions of electronic devices, the structures by which the microprocessors, memory devices, other semiconductor devices, and other electronic components of these devices are packaged and assembled with carriers, such as circuit boards, must become more compact. In general, the goal is to economically produce a chip-scale package (CSP) of the smallest size possible, and with conductive structures, such as leads, pins, or conductive bumps, which do not significantly contribute to the overall size in the X, Y, or Z dimensions, all while maintaining a very high performance level.

One approach to reducing the sizes of assemblies of semiconductor devices and circuit boards has been to minimize the profiles of the semiconductor devices and other electronic components upon carrier substrates (e.g., circuit boards) so as to reduce the distances the semiconductor devices protrude from the carrier substrates. Various types of packaging technologies have been developed to facilitate orientation of semiconductor devices upon carrier substrates in this manner.

Conventionally, semiconductor device packages are multilayered structures, typically including a bottom layer of encapsulant material, a carrier (e.g., leads, a circuit board, etc.), a semiconductor die, and a top layer of encapsulant material, for example. In addition, the leads, conductive bumps, or pins of conventional semiconductor device packages, which electrically connect such packages to carrier substrates, as well as provide support for the packages, are sometimes configured to space the semiconductor device packages apart from a carrier substrate. As a result, the overall thicknesses of these semiconductor device packages and the distances the packages protrude from carrier substrates are greater than is often desired for use in state of the art electronic devices.

Wafer level packaging (WLP) refers to packaging of an electronic component while it is still part of a wafer. The packages that are formed by WLP processes are generally considered to be "chip-sized" packages, at least with respect to the lateral X and Y dimensions, i.e., "footprint," but typically have somewhat enlarged profiles in the Z dimension due to the solder balls, pins, or other conductive structures that protrude therefrom. Likewise, modules of stacked dice may use inter-die connections comprising solder balls, pins, etc., which substantially contribute to the overall Z dimension, i.e., profile.

"Flip-chip" technology, as originating with controlled collapse chip connection (C-4) technology, is an example of an assembly and packaging technology that results in a semiconductor device being oriented substantially parallel to a carrier substrate, such as a circuit board. In flip-chip technology, the bond pads or contact pads of a semiconductor device are arranged in an array over a major surface of the semiconductor device. Flip-chip techniques are applicable to both bare and packaged semiconductor devices. A packaged flip-chip type semiconductor device, which typically has solder balls arranged in a so-called "ball grid array" (BGA) connection pattern, typically includes a semiconductor die and a carrier substrate, which is typically termed an "interposer." The interposer may be positioned adjacent either the back side of the semiconductor die or the active (front) surface thereof.

When the interposer is positioned adjacent the back side of the semiconductor die, the bond pads of the semiconductor die are typically electrically connected by way of wire bonds or other intermediate conductive elements to corresponding contact areas on a top side of the interposer. These contact areas communicate with corresponding bumped contact pads on the back side of the interposer. This type of flip-chip assembly is positioned adjacent a higher-level carrier substrate with the back side of the interposer facing the carrier substrate.

If the interposer is positioned adjacent the active surface of the semiconductor die, the bond pads of the semiconductor die may be electrically connected to corresponding contact areas on an opposite, top surface of the interposer by way of intermediate conductive elements that extend through one or more holes formed in the interposer. Again, the contact areas communicate with corresponding contact pads on the interposer. In this type of flip-chip semiconductor device assembly, however, the contact pads are also typically located on the top surface of the interposer. Accordingly, this type of flip-chip assembly is positioned adjacent a higher-level carrier substrate, such as a printed circuit board, by orienting the interposer with the top surface facing the carrier substrate.

In each of the foregoing types of flip-chip semiconductor devices, the contact pads of the interposer are disposed in an array that has a footprint that mirrors an arrangement of corresponding terminals or other contact regions formed on a carrier substrate. Each of the bond (on bare flip-chip semiconductor dice) or contact (on flip-chip packages) pads and its corresponding terminal may be electrically connected to one another by way of a conductive structure, such as a solder ball, that also spaces the interposer some distance away from the carrier substrate.

The space between the interposer and the carrier substrate may be left open or filled with a so-called "underfill" dielectric material that provides additional electrical insulation between the semiconductor device and the carrier substrate. In addition, each of the foregoing types of flip-chip semiconductor devices may include an encapsulant material covering portions or substantially all of the interposer and/or the semiconductor die.

The thicknesses of conventional flip-chip type packages having ball grid array connection patterns are defined by the combined thicknesses of the semiconductor die, the interposer, the adhesive material therebetween, and the conductive structures (e.g., solder balls) that protrude above the interposer or the semiconductor die. As with the flat packages, conventional flip-chip type packages are often undesirably thick for use in small, thin, state of the art electronic devices. Furthermore, use of this general construction method for producing a stacked multichip module (MCM) results in a relatively high-profile, large footprint device.

Thinner, or low-profile, flip-chip type packages have been developed which include interposers or other carriers with recesses that are configured to receive at least a portion of the profiles of semiconductor devices. While interposers that include recesses for partially receiving semiconductor devices facilitate the fabrication of thinner flip-chip type packages, the semiconductor dice of these packages, as well as intermediate conductive elements that protrude beyond the outer surfaces of either the semiconductor dice or the interposers, undesirably add to the thicknesses of these packages.

U.S. Pat. Nos. 5,541,450 and 5,639,695, both issued to Jones et al. (hereinafter "the '450 and '695 Patents"), disclose another type of flip-chip type package, which includes an interposer with a semiconductor die receptacle extending completely therethrough. The '695 Patent teaches a package that may be formed by securing a semiconductor die directly to a carrier substrate and electrically connecting the interposer to the carrier substrate before the semiconductor die is electrically connected to the interposer. The semiconductor die, intermediate conductive elements that connect bond pads of the semiconductor die to corresponding contact areas on the interposer, and regions of the interposer adjacent the receptacle may then be encapsulated. While this method results in a very low-profile flip-chip type package, the package cannot be tested separately from the carrier substrate. As a result, if the package is unreliable, it may also be necessary to discard the carrier substrate and any other components thereon. Moreover, the packaging method of the '695 Patent complicates the process of connecting semiconductor devices and other electronic components to a carrier substrate. In addition, it should be noted that in order to obtain a low-profile package, it may be necessary to sacrifice footprint compactness. The footprint area of such a low-profile package may be significantly greater than the area of the semiconductor die thereof.

Thus, there is a need for a multichip module which has a very low profile, may incorporate a large number of semiconductor packages of differing dimensions and is readily fabricated. There is also a need for a low-profile type multichip module that may be readily tested prior to its assembly with a carrier substrate and without adding complexity to the process of assembling electronic components to the carrier substrate. A method for fabricating such low-profile type packages is also needed.

SUMMARY OF THE INVENTION

In the present invention, stacked multichip modules are formed of semiconductor devices with castellated contacts, semiconductor device components, such as carriers, with castellated contacts, or some combination thereof.

In this invention, a plurality of semiconductor packages having differing sizes may be stacked in a very low-profile arrangement to form a stacked multichip module which has a small footprint, extremely high density, and superior signal integrity. Each semiconductor package is provided with castellated contacts, or outer connectors, for electrical connection to a carrier (e.g., a substrate such as a printed circuit board, an interposer, etc.) or to another semiconductor device. The castellated outer connectors are formed by providing conductive vias along die boundaries at the wafer level. Die singulation bisects each full via longitudinally into two via portions, each of which comprises a castellation via, i.e., outer connector, at the peripheral edge of one of the two adjacent singulated packages. Each outer connector is electrically connected to a conductive bond pad of the integrated circuit in the package's die by a conductive trace carried by the package.

Each outer connector may be exposed over its height from package top to package bottom, and may be formed with generally flat top and bottom ends. Both of the outer connector ends are readily connected by reflow to conductive surfaces on a substrate or another package with the same connector configuration. The outer connectors of such a package may be electrically connected to other packages or carrier substrates at their top sides, their back sides, their lateral surfaces, or any combination thereof Where the electronic device packages to be incorporated in a multichip module have different dimensions, i.e., are of different sizes, a plurality of the packages may be stacked with intervening thin package-size substrates having the same castellation connector configuration as the underlying package. Each of the specific size or type of package is separately formed and packaged at the wafer level. Thus, for example, a multichip module may include a package stack including a microprocessor package, a memory controller package, and one or more memory packages, all in a low-profile, chip footprint, three-dimensional module or package. The produced multichip module is particularly useful in various apparatus having severe space limitations, including, for example, miniature telephones, miniature computer devices, vehicle control devices, and a plethora of other miniature electronic apparatus. The multichip module of multiple packages is assembled and attached to a substrate without any height-adding interdie connectors such as solder balls, pins or the like.

The stacked multichip module may be surface mounted directly to a support substrate without solder balls, pins, columns, or other height-adding connectors.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, in which some dimensions may be exaggerated, exemplary embodiments for carrying out the invention are illustrated, wherein.

DETAILED DESCRIPTION OF THE INVENTION

Figure 1:
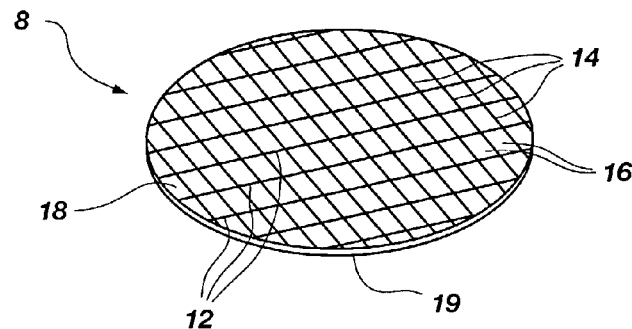
FIG. 1 is a perspective view of a multidie semiconductor wafer in which a plurality of low-profile device packages are formed with castellated outer connectors for incorporation in a multichip assembly in accordance with the present invention.

Referring to FIG. 1, a multichip substrate blank 8 is shown in which a plurality of dice 16 is shown as defined by boundary lines 12 and 14. In accordance with the invention, semiconductor device packages will be formed on the dice 16 in a manner which facilitates the stacking of the packages in a low-profile, small footprint multichip assembly. While substrate blank 8 depicted as comprising a full silicon wafer, use of other semiconductor substrates (e.g., partial wafers, substrates of other semiconductive materials, including, without limitation, gallium arsenide indium phosphide, and the like, as well as so-called silicon-on insulator, or SOI, type substrates) is also within the scope of the present invention.

The initial processes in forming package 10 may be any of those well-known and used throughout the industry. Thus, one side of the substrate blank 8 is selected as an active surface 18; the opposite side becomes the back side 19.

Figure 2:
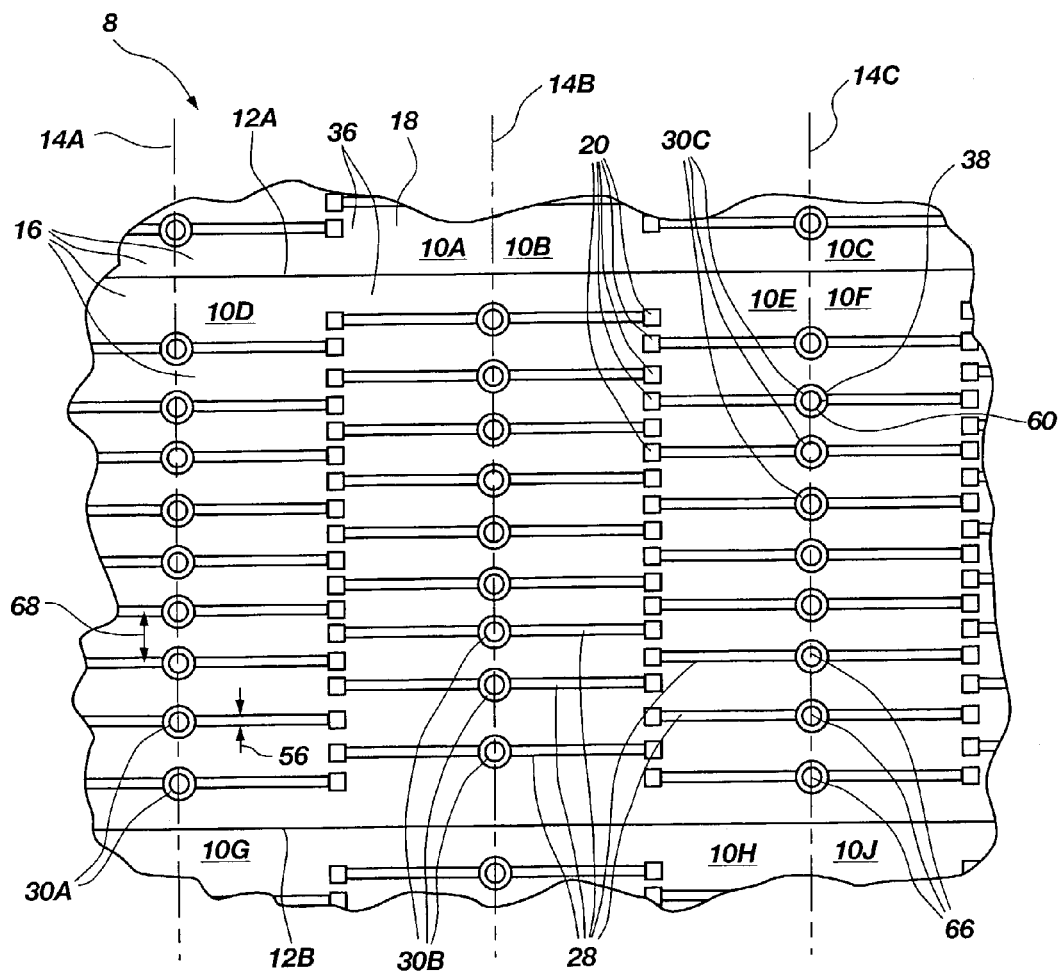
FIG. 2 is a plan view of an enlarged portion of an exemplary multidie semiconductor wafer formed into presingulated device packages in accordance with the teachings of the invention.

A pattern of planned straight boundary lines 12 and 14 in the X direction and Y direction, respectively, is provided for subdividing the substrate blank 8 into a plurality of unsingulated dice 16 for fabricating semiconductor device packages 10. As depicted in FIG. 2, the boundary lines 12A, 12B, etc. (collectively referred to as boundary lines 12) and 14A, 14B and 14C (collectively referred to as boundary lines 14) define the dimensions of each die 16, and comprise saw lines for singulation of each separate assembled package 10A, 10B, 10C, etc., which are also referred to as packages 10, from surrounding packages. For example, in FIG. 2, package 10E is shown as being surrounded by immediately adjacent packages 10A, 10B, 10C, 10D, 10F, 10G, 10H and 10J, all at the wafer level.

An integrated circuit 42 (see FIG. 7) is formed in each die 16 to interface with the active surface 18, as known in the art, and is configured in accordance with the desired end-use of the assembled package 10. A wide variety of integrated circuit device elements may be used in the die 16 of a package 10, including, for example, conductors, resistors, transistors, capacitors, inductors, insulators, and the like. Fabrication processes are used which typically fall into the groups known as layering, patterning, doping and heating, and many specific variations of each are well-known. For example, useful layering processes include various methods of oxidation, chemical vapor deposition (CVD), molecular beam epitaxy, physical vapor deposition (PVD), and other techniques.

As shown in FIG. 2, each package on substrate blank 8 is designated generically by the numeral 10, and is more particularly shown by a numeral 10A, 10B, 10C, 10D, 10E, etc., for purposes of relating adjacent packages with each other. Each package 10 is provided with a row of bond pads 20 which comprise primary terminals of the integrated circuit 42 (not visible) in the package. The upper surface, i.e., active surface 18, on which the bond pads 20 of each package 10 are located is covered by a layer 36 of dielectric material for insulating the underlying components of the integrated circuit 42 from external currents, including the effects of metallization to be formed thereon in accordance with the invention.

Figure 3:
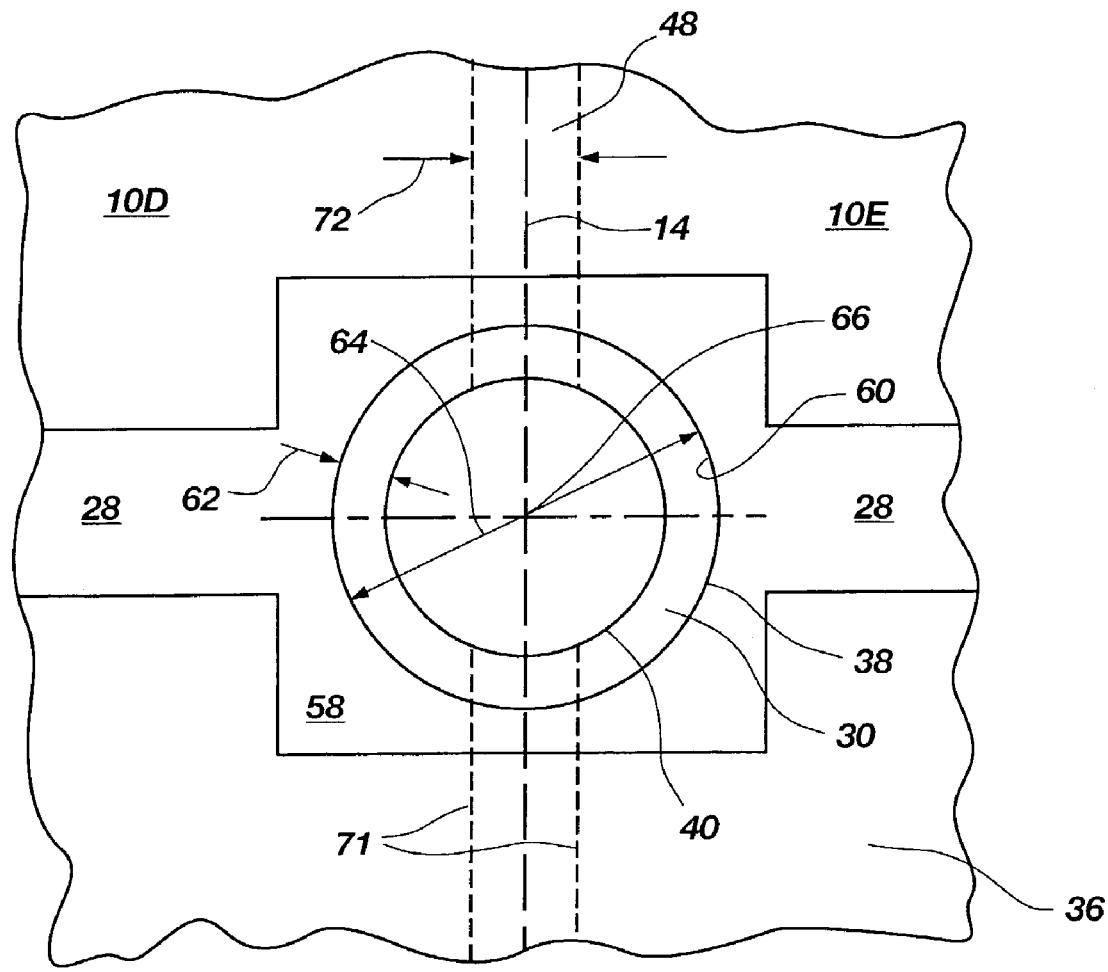
FIG. 3 is a plan view of a portion of a wafer showing a castellated full via formed at the interface of adjacent packages in accordance with teachings of the invention.

In the semiconductor packages 10 used in this invention, a metallization step is performed, creating conductive traces 28 atop dielectric layer 36 that substantially covers the active surface 18 and circuitry thereon. The traces 28 may be considered as "third level" conductors and extend to boundary lines 14 between adjacent packages 10. Each trace 28 may be of uniform width 56, as shown in FIG. 2, or may have an enlarged area 58 in the region immediately surrounding the intersection 66 of the traces 28 with boundary line 14, as shown in FIG. 3.

At the intersection 66 of each trace 28 with boundary line 14, a through-hole 38 is formed. Each through-hole 38 is coated with a conductive material to form a full, i.e., circular or cylindrical conductive via 30 (referred to in FIG. 2 as conductive vias 30A, 30B, 30C) having a hollow, circular or cylindrical center and electrically connected to trace 28. The full vias 30 are formed with a diameter 64, which is also the diameter of through-hole 38. An enlarged area 58 of trace 28 may be configured to essentially surround and be joined to the conductive via 30. A portion of the through-hole 38 and conductive via 30 formed therein are within the periphery of each of the adjacent packages 10D and 10E, as shown in FIG. 3. The conductive vias 30 are spaced apart from one another at a predetermined spacing or pitch 68 (FIG. 2). The arrangement of conductive vias 30 on a given boundary line 14 need not be uniform in pitch 68, provided that the arrangement of conductive vias 30 substantially mirrors the pattern of corresponding conductors of a carrier substrate to which the conductive vias 30 are to be connected.

The through-holes 38 may be formed in the substrate blank 8 by mechanical drilling, such as with a multiple spindle machine as used for drilling circuit boards. Alternatively, laser drilling, punching, etching, or other workable method may be used, depending on the via diameter 64 and aspect ratio, i.e., hole depth 70 to diameter 64 ratio. Hole formation by etching may be a viable alternative only where the aspect ratio of the hole is relatively low, i.e., less than about 7:1. The term "full" as used herein indicates that the through-hole 38 and conductive via 30 formed therein extend completely through the two adjacent packages 10 bounded by boundary line 14 (in this example, lines 14A, 14B, 14C, . . . 14N).

Following the formation of through-holes 38, the hole inside surfaces 60 may be cleaned (e.g., to remove drill smear, dust and burrs that may be generated during mechanical drilling) to establish a clean surface for via formation.

To form the conductive vias 30 in through-holes 38, a conductive material may be plated or coated onto the inside surface 60 of the through-hole 38. Methods used may include electroless plating, immersion plating, electrolytic plating, chemical vapor deposition (CVD) and physical vapor deposition (PVD), as exemplified by sputtering or evaporation, and other processes known in the art. The conductive vias 30 may be formed of a metal such as copper or aluminum, another metal, or metal alloy or a nonmetal conductor may be used. If the material of conductive vias 30 is not solder-compatible, but it may be desirable to subsequently adhere solder to conductive vias 30, each conductive via 30 may include one or more additional conductive barrier and/or noble metal layers. The plating or coating process effectively connects the formed conductive via 30 to the trace 28 and/or trace enlarged area 58, and thus to a bond pad 20 of the semiconductor package 10. In FIG. 3, a full conductive via 30 is shown as an annular member having a radial width 62 (also referred to as "coating thickness 62") extending from the inside surface 60 of the through-hole 38 to a surface of an axial opening 40. The coating thickness 62 may be sufficient to provide required strength as well as electrical conduction. Generally, the coating thickness 62 may be from about 1 to about 25 microns. Optionally, the entire through-hole 38 may be filled, although it requires additional time and material. Prior to package singulation, each conductive via 30 may communicate with conductive traces 28 of two adjacent semiconductor devices and, thus, may be shared by two adjacent packages 10. Thus, each full conductive via 30 is shown as being connected to a trace 28 on each package bounded by boundary line 14. For example, packages 10D and 10E share full vias 30 on the boundary line 14 between the two packages.

An additional layer 44 of dielectric material (FIG. 7) may be applied before package singulation to cover and protect the conductive traces 28.

Following completion of the packages 10 on substrate blank 8, the packages are singulated, typically by sawing along boundary lines 12, 14. As depicted in FIG. 3, the saw kerf 48 will typically have a kerf width 72 between kerf lines 71 and will permit a major portion of each conductive via 30 to remain within the peripheries of adjacent packages 10D and 10E, rather than be removed. Thus, the diameter 64 of each through-hole 38 is somewhat larger than the kerf width 72.

Figure 6:
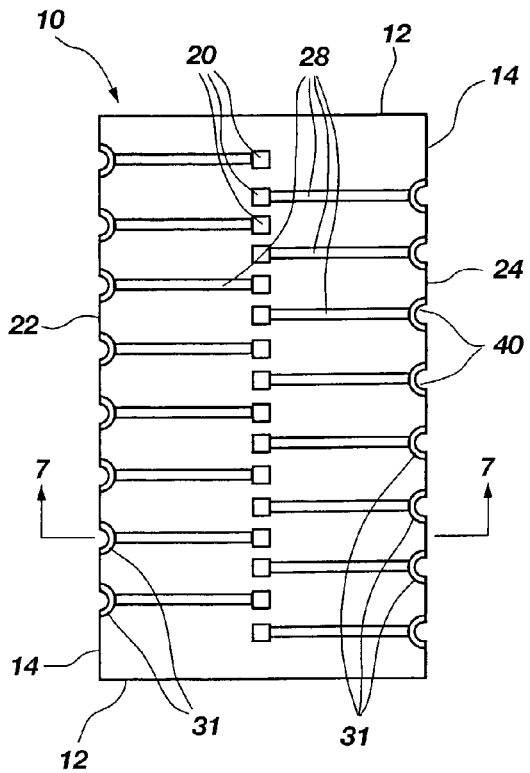
FIG. 6 is a plan view of a semiconductor package singulated from a wafer for incorporation in a multichip assembly of the invention.

Singulation of the packages 10 by cutting along boundary lines 12 and 14 simultaneously results in bisection of each full conductive via 30 into two via portions, or outer connectors 31. Thus, an outer connector 31 of each full conductive via 30 remains with each of the two adjacent packages 10. These outer connectors 31 will be simply designated hereinafter as peripheral vias or, in the context of the invention, as outer connectors 31. As shown in FIG. 6, a singulated package 10 from the wafer level of FIG. 2 has outer connectors 31 formed into both edges 22, 24 of the package periphery. A semicircular axial opening 40 in each outer connector 31 is exposed along the length 70 (FIG. 7) of the outer connector 31. The outer connector 31 (see FIG. 4) has an upper surface 76 and a lower surface 78, both of which are generally planar. The outer connector surfaces 76 and/or 78 may be approximately coplanar with upper and lower package surfaces 74, 34, respectively, or may protrude slightly beyond the package surfaces 74, 34.

Figure 5:
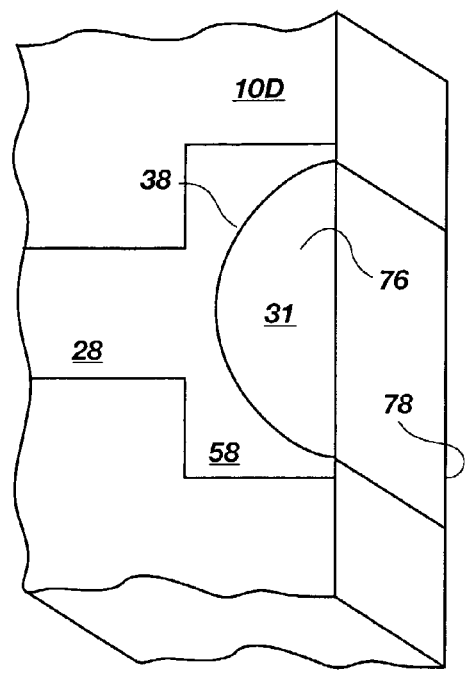
FIG. 5 is a schematic perspective view of a portion of a singulated package showing another embodiment of castellated outer connector for forming a multichip assembly of the invention.

As shown in an alternative embodiment in FIG. 5, an outer connector 31 may be formed by completely filling the through-hole 38 with conductive material.

The term "castellation" is used herein to denote the configuration imparted to an edge 22, 24 of a package that carries an array of bisected conductive vias 30, or outer connectors 31, in the periphery of a semiconductor device package or substrate. The outer connectors 31 are within the package 10 outline and extend from the upper surface 74 to the lower surface 34 of the package 10. Each outer connector 31 has an upper surface 76 and a lower surface 78 which may be connected to a conductive via of another semiconductor device or semiconductor device component or conductive sites formed on another package or substrate.

Figure 7:
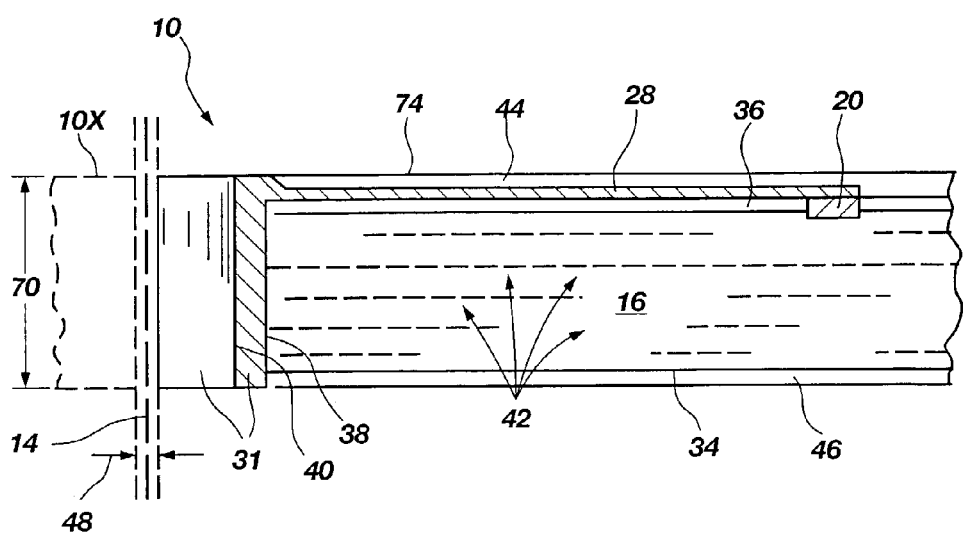
FIG. 7 is a schematic cross-sectional view of a portion of a singulated package for incorporation in a multichip assembly of the invention.

FIG. 7 is a cross-sectional view of a portion of a formed package 10, as cutting through an outer connector 31 with a central axial opening 40 formed therethrough. The lower surface 34 is typically covered by a lower protective layer 46, as known in the art. As shown, outer connector 31 is a deposition of a conductive material in through-hole 38. Die 16 contains an integrated circuit 42 which terminates in bond pads 20. An upper insulative, i.e., dielectric layer 36 protects integrated circuit 42 from electrical shorts and the like. A pattern of conductive metallization traces 28 is formed atop dielectric layer 36 to connect bond pads 20 with a boundary line 14 which is common to package 10 and its neighboring like package 10X on the wafer. Another dielectric insulative layer 44 may be applied to cover at least a portion of the upper surface 74 before forming and coating the through-holes 38.

Figure 4:
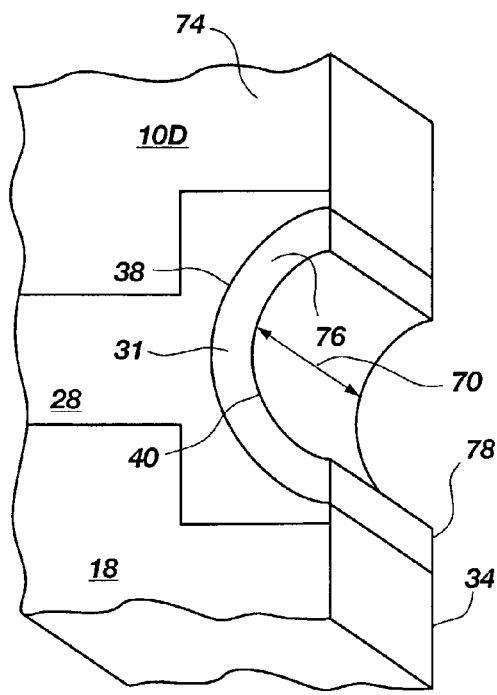
FIG. 4 is a schematic perspective view of a portion of a singulated package showing a castellated outer connector for forming a multichip assembly of the invention.
Figure 8:
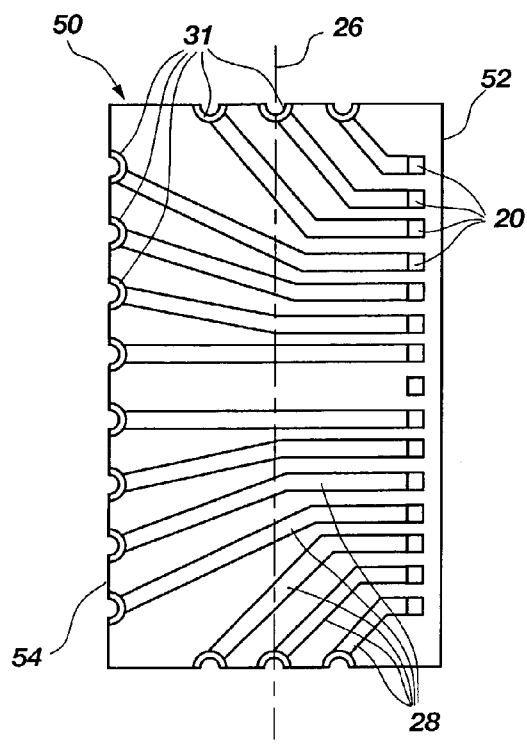
FIG. 8 is a plan view of another embodiment of a semiconductor package having outer castellated connectors on three sides of the package.

Also, as shown in FIG. 8, the invention may be applied to packages 50 having peripheral bond pads 20 along one edge 52 rather than along or near a central axis 26 of the package 50. The outer connectors 31 of package 50 may be formed on one or more nonpad edges 54 and connected to the bond pads 20 by conductive traces 28, as illustrated in FIG. 4. Of course, placement of bond pads 20 along one or more edges 54 of a die is also well known in the art. Accordingly, dice with other patterns of configurations of bond pads 20 and outer connectors 31 are also within the scope of the present invention provided there is sufficient peripheral space for the outer connectors 31.

It is noteworthy that the number of through-holes 38 to be drilled and filled is one-half the number of resulting outer connectors 31, saving process time.

Figure 9:
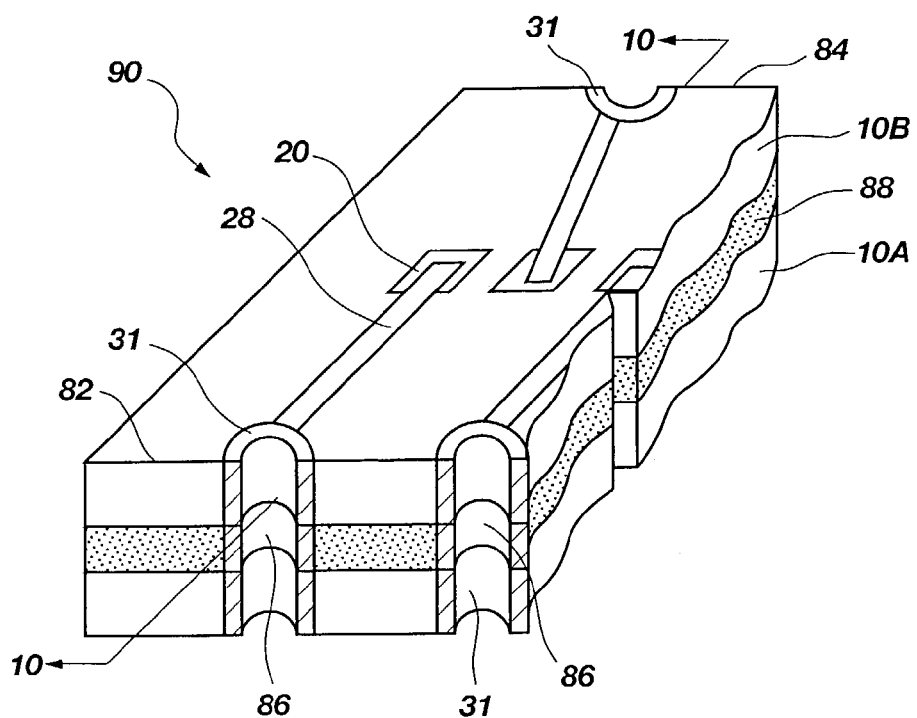
FIG. 9 is a schematic perspective view of an enlarged portion of two castellated packages joined by an intervening castellated substrate in accordance with teachings of the invention.
Figure 10:
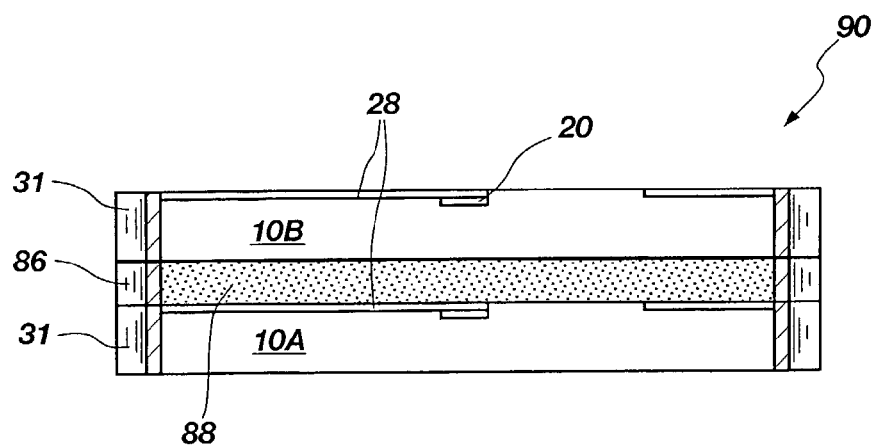
FIG. 10 is a cross-sectional view of an enlarged portion of two castellated packages joined by an intervening castellated substrate in accordance with the invention, as taken along line 10—10 of FIG. 9.

The packages 10, as described herein, may be joined to each other or to substrates 88 in a variety of ways, making them ideal for the formation of low-profile multichip assemblies 90. Several exemplary methods are illustrated in FIGS. 9, 10, 11, and 12. As depicted in FIGS. 9 and 10, two packages 10A and 10B of like dimensions and outer connector pattern may be joined mechanically and electrically with an intervening substrate 88 having the same dimensions and a pattern of outer connectors 86 comprising vias configured the same as outer connectors 31 on the packages. The outer connectors 31 and 86 may be joined end-to-end by solder reflow, and may be gang-bonded (i.e., more than two corresponding connectors are collectively bonded to one another by a single conductive element, such as a solder bump) to reduce construction time. The intervening substrate 88 may also contain surface or internal leads (not shown) connected to the outer connectors 86 for achieving a desired interconnection scheme. Additional levels of packages 10 and intervening substrates 88 of the same dimensions may be added to the assembly 90. The assembly 90 may be surface-mounted to a circuit board, not shown.

Figure 11:
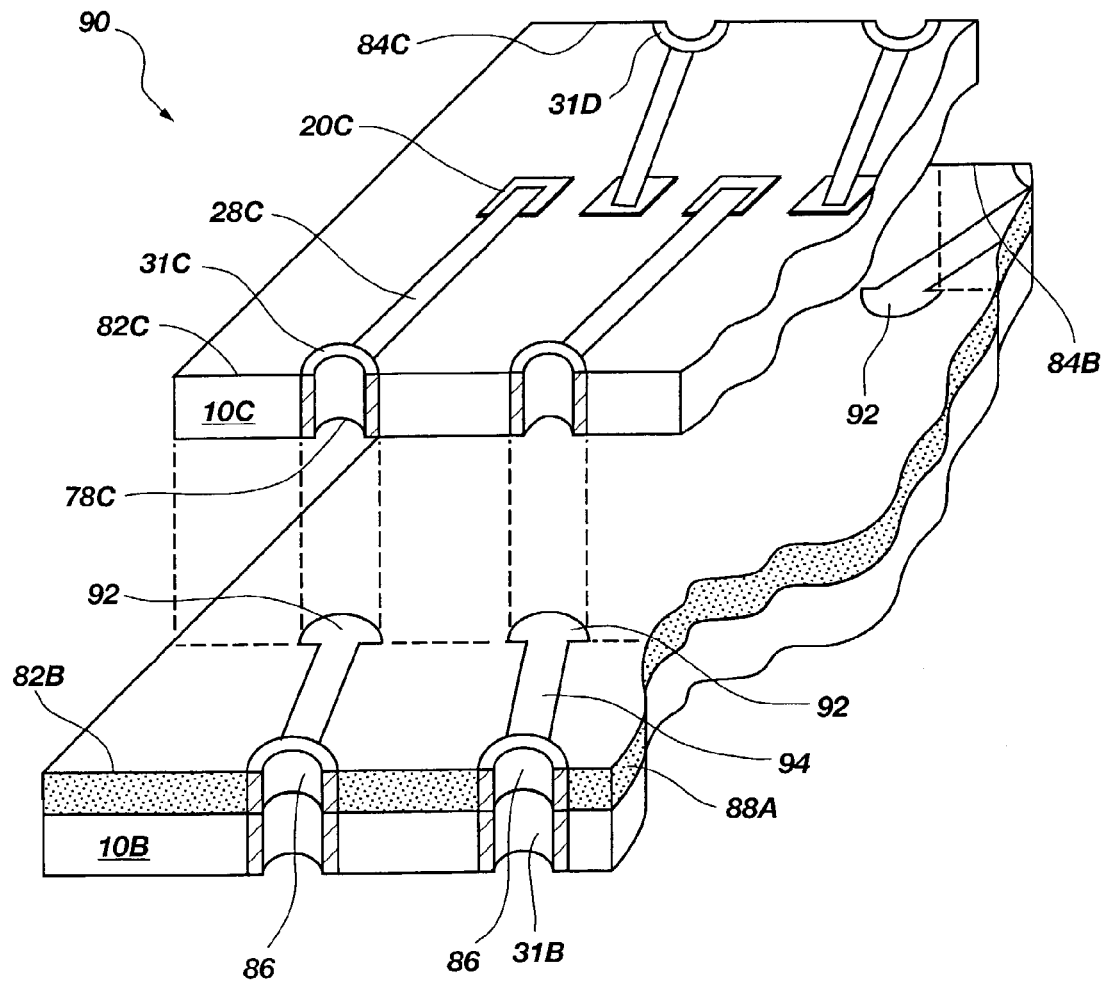
FIG. 11 is a partially exploded schematic perspective view of an enlarged portion of two castellated packages joined by an intervening castellated substrate in accordance with another embodiment of the invention.

When the packages 10 to be stacked in a multichip assembly are not of the same dimensions, another assembly configuration may be useful. As depicted in FIG. 11, an intermediate substrate 88A which has castellated outer connectors 86 which align with corresponding outer connectors 31B of package 10B may be superimposed over castellated package 10B. A second package 10C is shown as being smaller than package 10B, and the connector pitch and/or via diameter thereof may also differ from that of package 10B. The second package 10C has outer connectors 31C that are electrically connected to corresponding bond pads 20C by conductive traces 28C. A metallization pattern is provided on the substrate 88A. The substrate metallization includes bonding surfaces 92 conforming to the via pattern of the second package 10C and trace 94 which connect the bonding surfaces 92 to the substrate outer connectors 86. The bonding surfaces 92 may be of any shape suitable for bonding to the lower surfaces 78C of the outer connectors 31C. The bonding surfaces 92 are shown as semicircular, but may be circular, square, or oblong, for example.

Where the two packages 10B, 10C are of different sizes, but have outer connectors 31B and 31C of substantially the same size and arranged at substantially the same pitch, edge 82C of package 10C may be aligned with edge 82B of package 10B, and the outer connectors 31C may be joined in-line to outer connectors 86 of the substrate 88A. As edges 84B and 84C cannot then be aligned, substrate metallization 92, 94 may be used to connect outer connectors 31D to outer connectors 86 along edge 84B.

Figure 12:
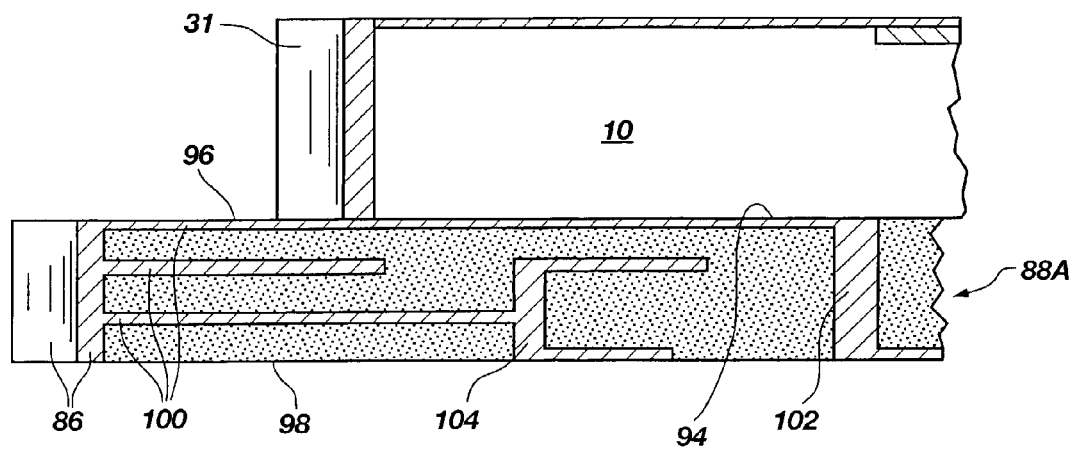
FIG. 12 is a cross-sectional side view of an enlarged portion of a castellated semiconductor package joined to a castellated multilevel substrate in accordance with teachings of the invention.

As shown in the sectional view of FIG. 12, an intermediate substrate 88A may have conductive traces 94, or metallization, on either the upper side 96 or lower side 98, or on both sides. In addition, internal traces 100, or internal leads, may be formed on one or more levels to enable interconnection of complex circuits The internal traces 100 may include, for example, full conductive vias 102, which extend substantially through the intermediate substrate 88A, and blind conductive vias 104, which extend only partially through the intermediate substrate 88A.

The substrate 88, 88A may comprise any material useful for the purpose. For example, the substrate may be substantially rigid, e.g., a copper-clad dielectric material, such as a fiber-reinforced resin. The resin may be, for example, epoxy, polyimide, bismaleimide triazine (BT), polytetrafluoroethylene (PTFE), and/or cyanate ester. The substrate 88, 88A may comprise a single layer or a laminate of multiple layers, each carrying conductive traces, or leads. Alternatively, substrate 88, 88A may be formed from ceramic or another material, for example.

Alternatively, the substrate 88, 88A may be flexible or rigid-flexible, such as KAPTON® or another polyimide tape. The tape of such a substrate 88, 88A may be punched, drilled or etched to form via through-holes for making peripheral outer connectors 86 (e.g., in the same manner as outer connectors 31 are formed).

For stacking a plurality of packages 10 that include castellated outer connectors 31 with intervening substrates 88 that include outer connectors 86, three of the various considerations relating to the outer connectors 31, 86 which affect the interconnection design are (a) via diameter 64, (b) outer connector pitch 68, and (c) package width dimension between castellated edges 82, 84 (FIG. 9) of packages 10 which have castellated appearances due to the outer connectors 31 therein.

Figure 13:
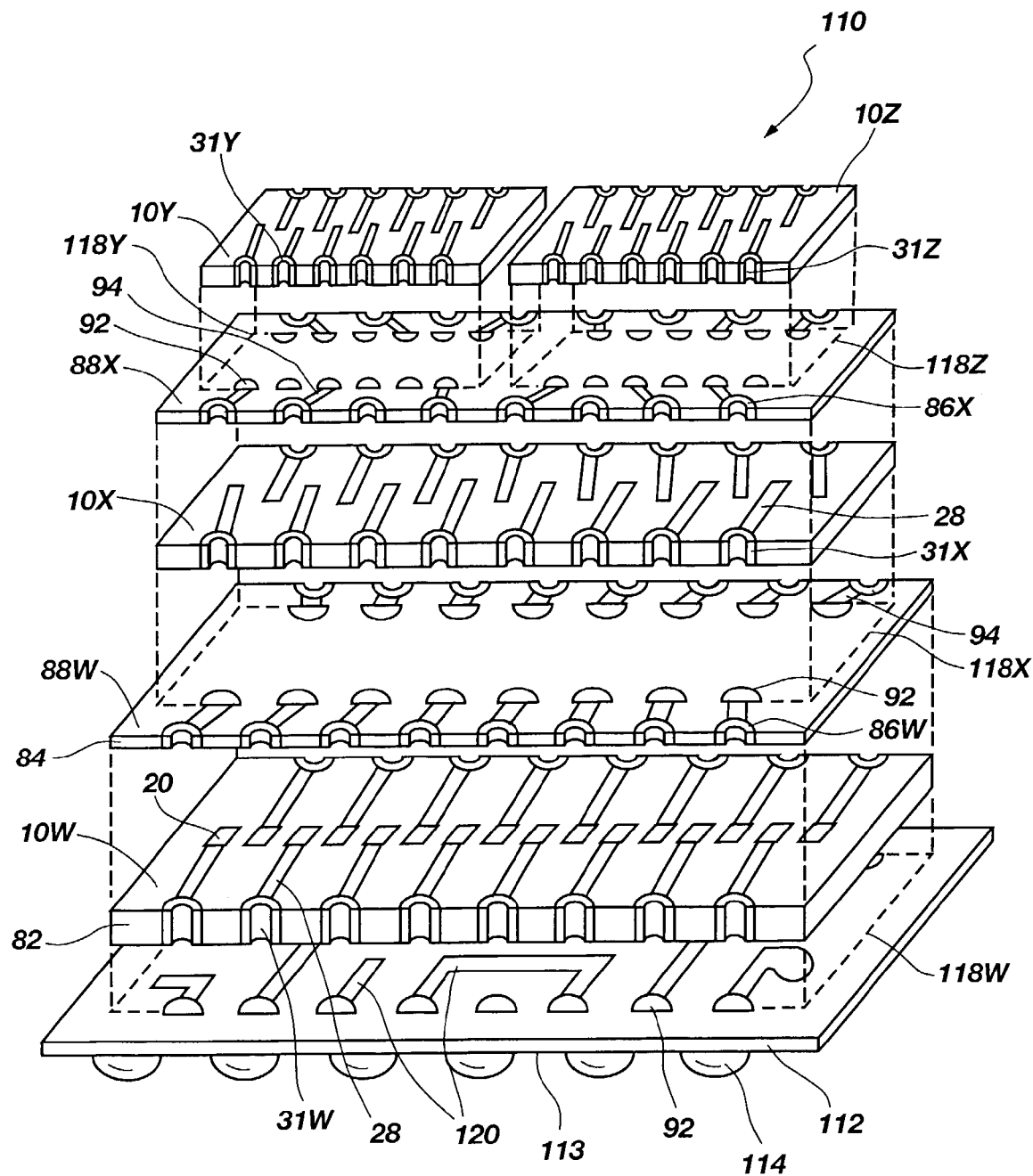
FIG. 13 is an exploded perspective view of an enlarged low-profile multichip assembly comprising castellated packages of differing sizes joined in accordance with teachings of the invention.
Figure 14:
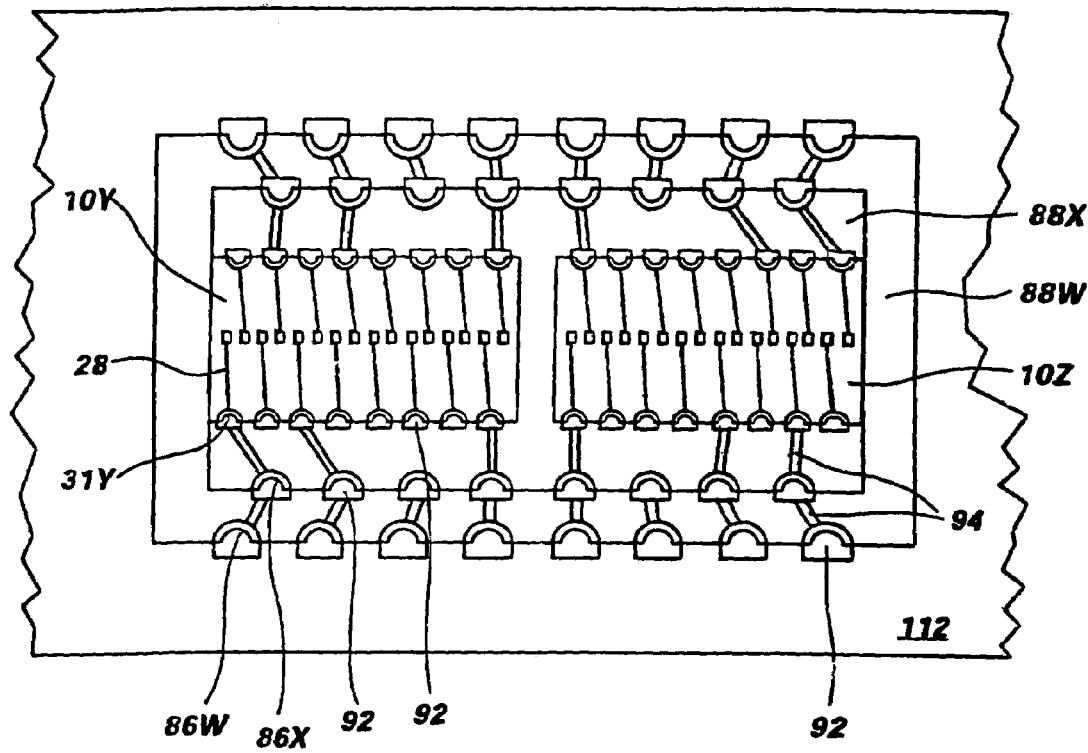
FIG. 14 is an enlarged plan view of an exemplary low-profile multichip assembly formed of castellated packages and castellated substrates in accordance with teachings of the invention.
Figure 15:
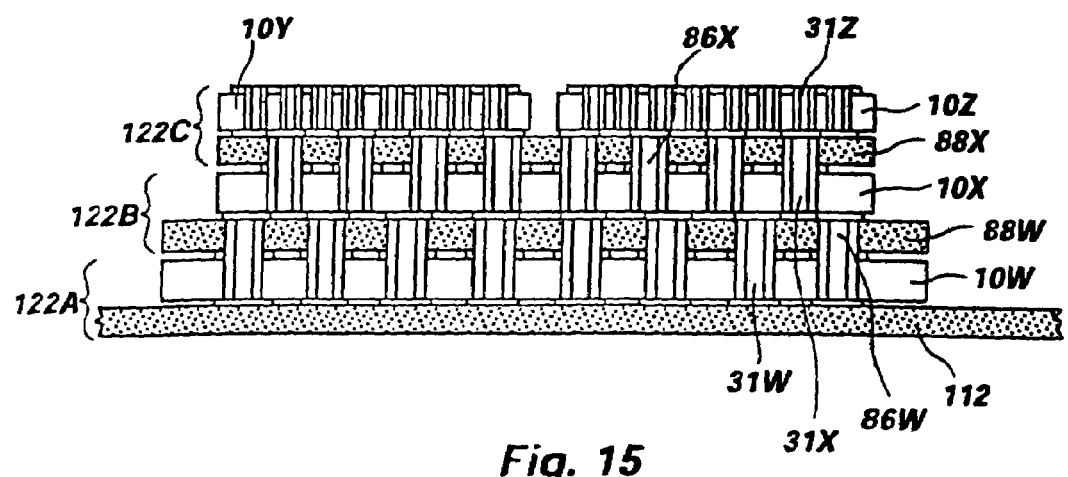
FIG. 15 is an enlarged side view of an exemplary low-profile multichip assembly formed of castellated packages and castellated substrates in accordance with teachings of the invention.

A low-profile multichip assembly or multichip module (MCM) 110 may be formed from a stack of wafer level semiconductor packages 10 described in the foregoing discussion. An example of such an assembly 110 is shown in FIGS. 13, 14, and 15. As depicted in FIG. 13, four semiconductor packages 10W, 10X, 10Y and 10Z (collectively referred to as packages 10) are stacked with intervening substrates 88W and 88X (collectively referred to as substrates 88). The assembly 110 may include a support substrate 112 for connection to a printed circuit board or other apparatus. As an example, assume that package 10W is a microprocessor, package 10X is a memory controller, and packages 10Y and 10Z are memory devices. The support substrate 112 may have an array of connectors 114 on its lower side 113. The connectors 114 may be in the form of a ball-grid-array (BGA), a pin-grid-array (PGA), columns, leadless chip carrier (LCC), or dual in-line package (DIP), for example. When assembled, the multichip assembly 110 comprises a complete computational system having a low profile and a footprint 118W which may be as small as that of the lowermost package 10W.

In this example, it should be noted that each successively higher package in the MCM 110 has a smaller width (between connector carrying edges 82 and 84). Furthermore, the pitch 68 of outer connectors 31 of each successively higher package 10 is shown as being smaller than the pitch of the outer connectors 31 of the next lower package 10. Thus, the multichip assembly or MCM 110 is not limited to the use of packages 10 having the same width 116, via diameter 64 (FIG. 3) or outer connector pitch 68 (FIG. 2). This versatility is important in construction of "system" or subsystem modules.

In the embodiment shown in FIGS. 13–15, each intermediate substrate 88 is constructed to be substantially the same size as the underlying package 10 and have a pattern of outer connectors 86 which is the same pattern as the pattern of outer connectors 31 on the underlying package. Thus, substrate 88W is substantially the same size as package 10W and has a pattern of peripheral outer connectors 86W which match outer connectors 31W of the package 10W. It is noted that dielectric layers on the surfaces of each package 10 and substrate 88 are not shown, in order to illustrate conductive traces 28 and 94. The footprint of both package 10W and substrate 88W on support substrate 112 is denoted by the numeral 118W. Likewise, substrate 88X is the same size as package 10X and has an outer connector 86X pattern that matches the outer connector 31X of package 10X. The pattern footprint 18X of package 10X and substrate 88X on substrate 88W is also shown. Packages 10Y and 102 have patterns of outer connectors 31Y, 312, respectively. Each of the packages 10Y and 10Z has a footprint 118Y or 118Z which appears on the surface of substrate 88X.

Starting with packages 10 and intermediate substrates 88, the MCM 110 may be formed by stacking the elements as shown in FIG. 13. Package 10W may be considered as the lowest-level of the MCM 110, upon which are connected, in sequence, substrate 88W, package 10X, substrate 88X, and packages 10Y and 10Z. The castellated outer connectors 31 and 86 of each package 10 or substrate 88 may be gang-bonded to a lower member by solder reflow. Alternatively, the MCM 110 may be provided with a support substrate 112, which is the lowest-level element of the MCM 110. Typically, the support substrate 112 of the MCM 110 will have an array of bonding surfaces 92 to which outer connectors 31W may be attached. Conductive traces 120, or metallization, on the support substrate 112 connects the bonding surfaces 92 to an array of connectors 114 for connection of the MCM 110 to a circuit board, for example. The connectors 114 may comprise any workable conductive elements, such as a ball-grid-array (BGA), pin-grid-array (PGA), dual in-line connectors, or leadless chip carrier (LCC) connectors, for example.

Forming an MCM 110, as described, results in a low-profile assembly, as shown in FIGS. 14 and 15, which has no solder balls, pins, or other height-adding elements between packages 10 and intermediate substrates 88. Not only does the MCM 110 have an extremely low profile, but its footprint may be equal to, or slightly larger than, the lowest-level package 10W thereof. The castellated outer connectors 31 and 86 provide an excellent electrical bond and establish a strong mechanical bond between packages and substrates. A relatively large number of packages may be incorporated in a single stacked assembly-type MCM 110, enabling creation of a full system or subsystem on a single low-profile, chip-sized multichip assembly. Typically, the MCM 110 is encapsulated with a dielectric material to protect the otherwise exposed outer connectors 31 and 86.

As already indicated, the intermediate substrates 88 may comprise any of a wide variety of substrate types. For example, the substrates 88 may vary in rigidity from a rigid material to a flexible tape or film. The support substrate 112 of the MCM 110 may be similarly formed, but without castellated outer connectors 86.

As shown in FIGS. 14 and 15, package 10W and support substrate 112 may together be considered as a first package level 122A. Package 10X and intermediate substrate 88W may together be considered as a second package level 122B. Packages 10Y and 10Z, together with substrate 88X, may be considered as a third package level 122C. Additional levels of packages 10 and substrates 88 may be added to produce a desired miniature system or subsystem.

As described above, the multichip assembly 90 may be readily fabricated using processes and equipment which are widely used or known in the electronics industry. The package 10 of the present invention may have a total thickness of less than about 1 mm, making the MCM 110 suitable for use in compact electronic devices, such as cellular telephones, handheld computers, and a plethora of other small electronic devices, where such low-profile assemblies 110 are required or desired.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for assembling semiconductor device components, comprising:

positioning a semiconductor die, a plurality of conductive connectors carried by at least one peripheral edge of the semiconductor die, over a surface of a carrier and in substantially parallel relation to the surface;

aligning at least some conductive connectors of the plurality of conductive connectors with corresponding contact areas of the plurality of contact areas on the surface of the carrier; and electrically connecting the at least some conductive connectors with the corresponding contact areas.

2. The method of claim 1, wherein positioning the semiconductor die comprises positioning the semiconductor die over a surface of at least one of an intermediate substrate, a support substrate, a circuit board, and a semiconductor device.

3. The method of claim 1, wherein positioning the second semiconductor device component comprises positioning a second semiconductor device component with at least some conductive connectors of the plurality of conductive connectors including recesses formed therein and extending substantially from a first major surface of the semiconductor die to an opposite, second major surface of the semiconductor die.

4. The method of claim 3, wherein positioning the semiconductor die comprises positioning the semiconductor die with the recesses of the at least some conductive connectors comprising semicylindrical recesses.

5. The method of claim 4, wherein positioning the semiconductor die comprises positioning the semiconductor die over a carrier including at least some contact areas of the plurality of contact areas that are located on a peripheral edge thereof.

6. The method of claim 5, wherein positioning the semiconductor die comprises positioning the semiconductor die over a carrier including at least some contact areas of the plurality of contact areas that include recesses formed therein that extend substantially from a first major surface of the carrier to an opposite, second major surface of the carrier.

7. The method of claim 6, wherein aligning comprises aligning at least some recesses of the recesses of the at least some conductive connectors of the semiconductor die with corresponding recesses of the at least some contact areas of the carrier.

8. The method of claim 7, wherein electrically connecting includes introducing a preformed elongate conductive element within aligned recesses of at least one conductive connector of the at least some conductive connectors and of at least one contact area of the at least some contact areas.

9. The method of claim 3, wherein electrically connecting comprises introducing an elongate conductive element that is in electrical communication with a contact area of the plurality of contact areas of the carrier into a recess of a corresponding conductive connector of the at least some conductive connectors of the semiconductor die so as to contact a surface of the corresponding conductive connector.

10. The method of claim 1, wherein electrically connecting comprises placing conductive material between the at least some conductive connectors and the corresponding contact areas.

11. The method of claim 10, wherein electrically connecting further comprises bonding discrete quantities of the conductive material to each conductive connector of the at least some conductive connectors and a corresponding contact area of the corresponding contact areas.

12. The method of claim 10, wherein placing conductive material comprises placing solder between the at least some conductive connectors and the corresponding contact areas.

13. A method for assembling semiconductor device components, comprising:
positioning a semiconductor die, a plurality of conductive connectors located on at least one peripheral edge of the semiconductor die, over and in substantially parallel relation to a surface of a carrier;
aligning at least some conductive connectors of the plurality of conductive connectors with corresponding contact areas of the carrier; and
positioning the at least some conductive connectors against the corresponding contact areas.

14. The method of claim 13, wherein positioning comprises positioning the semiconductor die over the surface of a carrier comprising at least one of an intermediate substrate, a support substrate, a circuit board, and a semiconductor device.

15. The method of claim 13, wherein positioning the semiconductor die comprises positioning a semiconductor die with at least some conductive connectors of the plurality of conductive connectors including recesses formed therein and extending substantially from a first major surface of the semiconductor die to an opposite, second major surface of the semiconductor die.

16. The method of claim 15, wherein positioning the second semiconductor device comprises positioning the semiconductor die with the recesses of the at least some conductive connectors comprising semicylindrical recesses.

17. The method of claim 16, wherein positioning comprises positioning the semiconductor die over the surface of a carrier comprising at least some contact areas of the plurality of contact areas that are located on a peripheral edge thereof.

18. The method of claim 17, wherein positioning comprises positioning the semiconductor die over the surface of a carrier comprising at least some contact areas of the plurality of contact areas that include recesses formed therein and that extend substantially from a first major surface of the carrier to an opposite, second major surface of the carrier.

19. The method of claim 18, wherein aligning comprises aligning at least some recesses of the recesses of the at least some conductive connectors of the semiconductor die with corresponding recesses of the at least some contact areas of the carrier.

20. The method of claim 19, wherein electrically connecting includes introducing a preformed elongate conductive element within aligned recesses of at least one conductive connector of the at least some conductive connectors and of at least one contact area of the at least some contact areas.

21. The method of claim 15, wherein electrically connecting comprises introducing an elongate conductive element that is in electrical communication with a contact area of the plurality of contact areas of the carrier into a recess of a corresponding conductive connector of the at least some conductive connectors of the semiconductor die so as to contact a surface of the corresponding conductive connector.

22. The method of claim 13, wherein electrically connecting comprises placing conductive material between the at least some conductive connectors and the corresponding contact areas.

23. The method of claim 22, wherein electrically connecting further comprises bonding discrete quantities of the conductive material to each conductive connector of the at least some conductive connectors and a corresponding contact area of the corresponding contact areas.

24. The method of claim 22, wherein placing conductive material comprises placing solder between the at least some conductive connectors and the corresponding contact areas.

25. A method for assembling semiconductor device components, comprising:
positioning a semiconductor die over a surface of a carrier, at least one conductive connector located on or adjacent to at least one peripheral edge of the semiconductor die, the at least one conductive connector including a recess in a surface thereof, the recess extending substantially from a first major surface of the semiconductor die to an opposite, second major surface of the semiconductor die; aligning the at least one conductive connector with a corresponding contact area on the surface of the carrier; and
electrically connecting the at least one conductive connector with the corresponding contact area.

26. The method of claim 25, wherein positioning the semiconductor die comprises positioning the semiconductor die over a surface of at least one of an intermediate substrate, a support substrate, a circuit board, and a semiconductor device.

27. The method of claim 25, wherein positioning the semiconductor die comprises positioning the semiconductor die with the recess of the at least one conductive connector comprising a semicylindrical recess.

28. The method of claim 27, wherein positioning the semiconductor die comprises positioning the semiconductor die over a carrier including at least one contact area located on a peripheral edge thereof.

29. The method of claim 28, wherein positioning the semiconductor die comprises positioning the semiconductor die over a carrier including at least one contact area that includes a recess formed therein that extends substantially from a first major surface of the carrier to an opposite, second major surface of the carrier.

30. The method of claim 29, wherein aligning comprises aligning the recess of the recesses of the at least one conductive connector of the semiconductor die with the recess of the at least one contact area of the carrier.

31. The method of claim 30, wherein electrically connecting includes introducing an elongate conductive element within aligned recesses of the at least one conductive connector and of the at least one contact area.

32. The method of claim 25, wherein electrically connecting comprises introducing a preformed elongate conductive element that is in electrical communication with the at least one contact area of the carrier into the recess of the at least one conductive connector of the semiconductor die so as to contact a surface of the at least one conductive connector.

33. The method of claim 25, wherein electrically connecting comprises placing conductive material between the at least one conductive connector and the corresponding contact area.

34. The method of claim 33, wherein electrically connecting further comprises bonding discrete quantities of the conductive material to the at least one conductive connector and the corresponding contact area.

35. The method of claim 33, wherein placing conductive material comprises placing solder between the at least one conductive connector and the corresponding contact area.

36. A method for assembling semiconductor device components, comprising:

positioning a second semiconductor device component, including:
- a plurality of conductive connectors carried by at least one peripheral edge thereof; and
- a corresponding plurality of conductive traces carried by and extending across a surface thereof,
- over a surface of a first semiconductor device component and in substantially parallel relation to the surface;

aligning at least some conductive connectors of the plurality of conductive connectors with corresponding contact areas of the plurality of contact areas on the surface of the first semiconductor device component; and electrically connecting the at least some conductive connectors with the corresponding contact areas.

37. The method of claim 36, wherein positioning the second semiconductor device component comprises positioning the second semiconductor device component over a surface of at least one of an intermediate substrate, a support substrate, a circuit board, and a semiconductor device.

38. The method of claim 36, wherein the second semiconductor device component comprises a semiconductor device.

39. The method of claim 36, wherein positioning the second semiconductor device component comprises positioning a second semiconductor device component with at least some conductive connectors of the plurality of conductive connectors including recesses formed therein and extending substantially from a first major surface of the second semiconductor device component to an opposite, second major surface of the second semiconductor device component.

40. The method of claim 39, wherein positioning the second semiconductor device component comprises positioning the second semiconductor device component with the recesses of the at least some conductive connectors comprising semicylindrical recesses.

41. The method of claim 40, wherein positioning the second semiconductor device component comprises positioning the second semiconductor device component over a first semiconductor device component including at least some contact areas of the plurality of contact areas that are located on a peripheral edge thereof.

42. The method of claim 41, wherein positioning the second semiconductor device component comprises positioning the second semiconductor device component over a first semiconductor device component including at least some contact areas of the plurality of contact areas that include recesses formed therein that extend substantially from a first major surface of the first semiconductor device component to an opposite, second major surface of the first semiconductor device component.

43. The method of claim 42, wherein aligning comprises aligning at least some recesses of the recesses of the at least some conductive connectors of the second semiconductor device component with corresponding recesses of the at least some contact areas of the first semiconductor device component.

44. The method of claim 43, wherein electrically connecting includes introducing a preformed elongate conductive element within aligned recesses of at least one conductive connector of the at least some conductive connectors and of at least one contact area of the at least some contact areas.

45. The method of claim 39, wherein electrically connecting comprises introducing an elongate conductive element that is in electrical communication with a contact area of the plurality of contact areas of the first semiconductor device component into a recess of a corresponding conductive connector of the at least some conductive connectors of the second semiconductor device component so as to contact a surface of the corresponding conductive connector.

46. The method of claim 36, wherein electrically connecting comprises placing conductive material between the at least some conductive connectors and the corresponding contact areas.

47. The method of claim 46, wherein electrically connecting further comprises bonding discrete quantities of the conductive material to each conductive connector of the at least some conductive connectors and a corresponding contact area of the corresponding contact areas.

48. The method of claim 47, wherein placing conductive material comprises placing solder between the at least some conductive connectors and the corresponding contact areas.

* * * * *